United States Patent
Yoon et al.

(10) Patent No.: US 12,262,133 B2
(45) Date of Patent: Mar. 25, 2025

(54) RAMP SIGNAL GENERATING DEVICE AND IMAGE SENSOR FOR REDUCING RAMP SIGNAL LATENCY

(71) Applicant: SAMSUNG ELECTRONICS CO., LTD., Suwon-si (KR)

(72) Inventors: Younghyun Yoon, Suwon-si (KR); Haneul Jung, Suwon-si (KR); Dongjae Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 105 days.

(21) Appl. No.: 18/213,032

(22) Filed: Jun. 22, 2023

(65) Prior Publication Data
US 2024/0163582 A1 May 16, 2024

(30) Foreign Application Priority Data
Nov. 10, 2022 (KR) .................. 10-2022-0149839

(51) Int. Cl.
*H04N 25/767* (2023.01)
*H04N 25/616* (2023.01)
*H04N 25/772* (2023.01)

(52) U.S. Cl.
CPC ......... *H04N 25/767* (2023.01); *H04N 25/616* (2023.01); *H04N 25/772* (2023.01)

(58) Field of Classification Search
None
See application file for complete search history.

(56) References Cited

U.S. PATENT DOCUMENTS

| | | |
|---|---|---|
| 6,956,413 B2 | 10/2005 | Bailey |
| 8,766,843 B2 | 7/2014 | Ueno |
| 9,781,368 B2 | 10/2017 | Song |
| 10,490,495 B2 | 11/2019 | Jung et al. |
| 10,931,268 B2 | 2/2021 | Kim |
| 2003/0151570 A1 | 8/2003 | LeChevalier et al. |
| 2011/0279723 A1* | 11/2011 | Takamiya ........... H03M 1/0612 348/308 |

FOREIGN PATENT DOCUMENTS

| | | |
|---|---|---|
| KR | 10-2018-0014298 A | 2/2018 |
| KR | 10-2019-0094924 A | 8/2019 |
| KR | 10-2386471 B1 | 4/2022 |

* cited by examiner

*Primary Examiner* — Mark T Monk
(74) *Attorney, Agent, or Firm* — Sughrue Mion, PLLC

(57) ABSTRACT

A ramp signal generating device and an image sensor for decreasing the latency of a ramp signal are provided. The ramp signal generating device may include a first circuit configured to detect a capacitance of a parasitic capacitor, a second circuit configured to charge the parasitic capacitor with a first voltage, and a third circuit configured to receive the capacitance as an input to generate a load current causing the ramp signal with a predetermined slope.

20 Claims, 15 Drawing Sheets

FIG. 8A

| @dVRAMP/dt=1.2V/1us | | | | | | | | |
|---|---|---|---|---|---|---|---|---|
| $I_{DET}$ [uA] | VREF [V] | Time [ns] | $C_{load}$ [pF] | $I_{load}$ [uA] | | | | |
| | | | | @gain x1 | @gain x2 | @gain x4 | @gain x8 | @gain x16 |
| 500 | 1.2 | 480 | 200 | 240 | 120 | 60 | 30 | 15 |

FIG. 8C

| @ 1.2V ramping start level(V1), 200pF Cload, dVRAMP/dt=1.2V/1us | | | |
|---|---|---|---|
| | $R_{load} [\Omega]$ | Current [mA] | Current [%] |
| RAMP SIGNAL GENERATING DEVICE (130') OF FIG. 7 | 120 | 10 | 100 |
| RAMP SIGNAL GENERATING DEVICE (130) OF FIG. 2 | – | 0.24 | 2.4 |

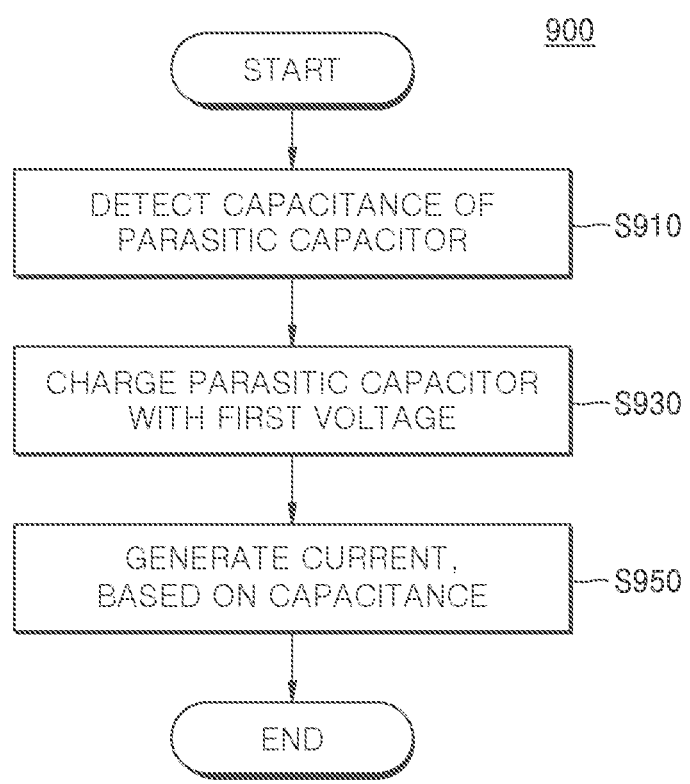

RAMP SIGNAL GENERATING DEVICE AND IMAGE SENSOR FOR REDUCING RAMP SIGNAL LATENCY

CROSS-REFERENCE TO RELATED APPLICATION

This application is based on and claims priority under 35 U.S.C. § 119 to Korean Patent Application No. 10-2022-0149839, filed on Nov. 10, 2022, in the Korean Intellectual Property Office, the disclosure of which is incorporated by reference herein in its entirety.

BACKGROUND

The present disclosure relates to a ramp signal generating device, and more particularly, to a ramp signal generating device, which generates a ramp signal by using a parasitic capacitor without a load resistor so as to reduce the latency of the ramp signal, and an image sensor.

Image sensors are devices which capture a two-dimensional or three-dimensional image of an object. Image sensors generate an image of an object by using a photoelectric conversion device which reacts based on the strength of light reflected from the object. Recently, as complementary metal-oxide semiconductor (CMOS) technology advances, CMOS image sensors using CMOS are being widely used.

In column-parallel analog-to-digital circuits which are being widely used among analog-to-digital conversion circuits of CMOS image sensors, an output of one ramp signal generating device is connected with analog-to-digital circuits of all columns. A high parasitic capacitance occurs in an output node of a ramp signal generating device, and due to this, the latency of a ramp signal occurs in generating a ramp signal. Therefore, the latency of a ramp signal causes a problem where an integral nonlinearity (INL) characteristic of an analog-to-digital circuit is reduced, and thus, ramp signal generating devices for solving the problem are needed.

SUMMARY

Example embodiments provide a ramp signal generating device, which may generate a ramp signal by using a parasitic capacitor without a load resistor and may reduce the latency of the ramp signal, and an image sensor.

According to an aspect of an example embodiment, a ramp signal generating device includes: an output node configured to output a ramp signal; a first circuit configured to detect, based on a measurement value, a capacitance of a parasitic capacitor; a second circuit configured to charge the ramp signal of the output node with a ramp signal start voltage; and a third circuit configured to generate a load current enabling the ramp signal start voltage to vary with a first predetermined slope, based on the detected capacitance, wherein the parasitic capacitor is associated with the output node provided between the output node and a plurality of buffers which are connected to the output node and receive and buffer the ramp signal, and the plurality of buffers are configured to transfer the buffered ramp signal to corresponding ones of a plurality of comparators.

According to an aspect of an example embodiment, a method of generating a ramp signal in an image sensor, includes: a first operation of detecting, based on a measurement value, a capacitance of a parasitic capacitor of an output node of a ramp signal generating device provided between the output node of the ramp signal generating device and a plurality of buffers which receive and buffer the ramp signal, wherein the plurality of buffers are configured to transfer the buffered ramp signal to corresponding ones of a plurality of comparators; a second operation of charging the ramp signal with a ramp signal start voltage; and a third operation of generating a load current enabling the ramp signal start voltage to vary with a first predetermined slope, based on the detected capacitance.

According to an aspect of an example embodiment, an image sensor includes: a pixel array including a plurality of pixels, the pixel array being connected to a plurality of column lines configured to output a plurality of pixel signals generated from the plurality of pixels, respectively; a ramp signal generating device configured to generate a ramp signal; a plurality of buffers connected to an output terminal of the ramp signal generating device and configured to receive and buffer the ramp signal, wherein the plurality of buffers are configured to transfer the buffered ramp signal to corresponding ones of a plurality of comparators; an analog-to-digital conversion circuit configured to analog-to-digital convert the plurality of pixel signals, based on the ramp signal; and a timing controller configured to control a timing of the ramp signal generating device, wherein the ramp signal generating device includes: a first circuit configured to detect a capacitance of a parasitic capacitor provided between the output terminal of the ramp signal generating device and the plurality of buffers; a second circuit configured to charge the ramp signal with a ramp signal start voltage; and a third circuit configured to generate a load current enabling the ramp signal start voltage to vary with a first predetermined slope, based on the detected capacitance.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 8A and 8B are a look-up table and a graph for describing an operation of a ramp signal generating device according to an embodiment, and FIG. 8C is a table showing a result obtained by comparing current consumptions of ramp signal generating devices;

FIG. 9 is a flowchart illustrating a ramp signal generating method according to an embodiment.

DETAILED DESCRIPTION

Figure 1:
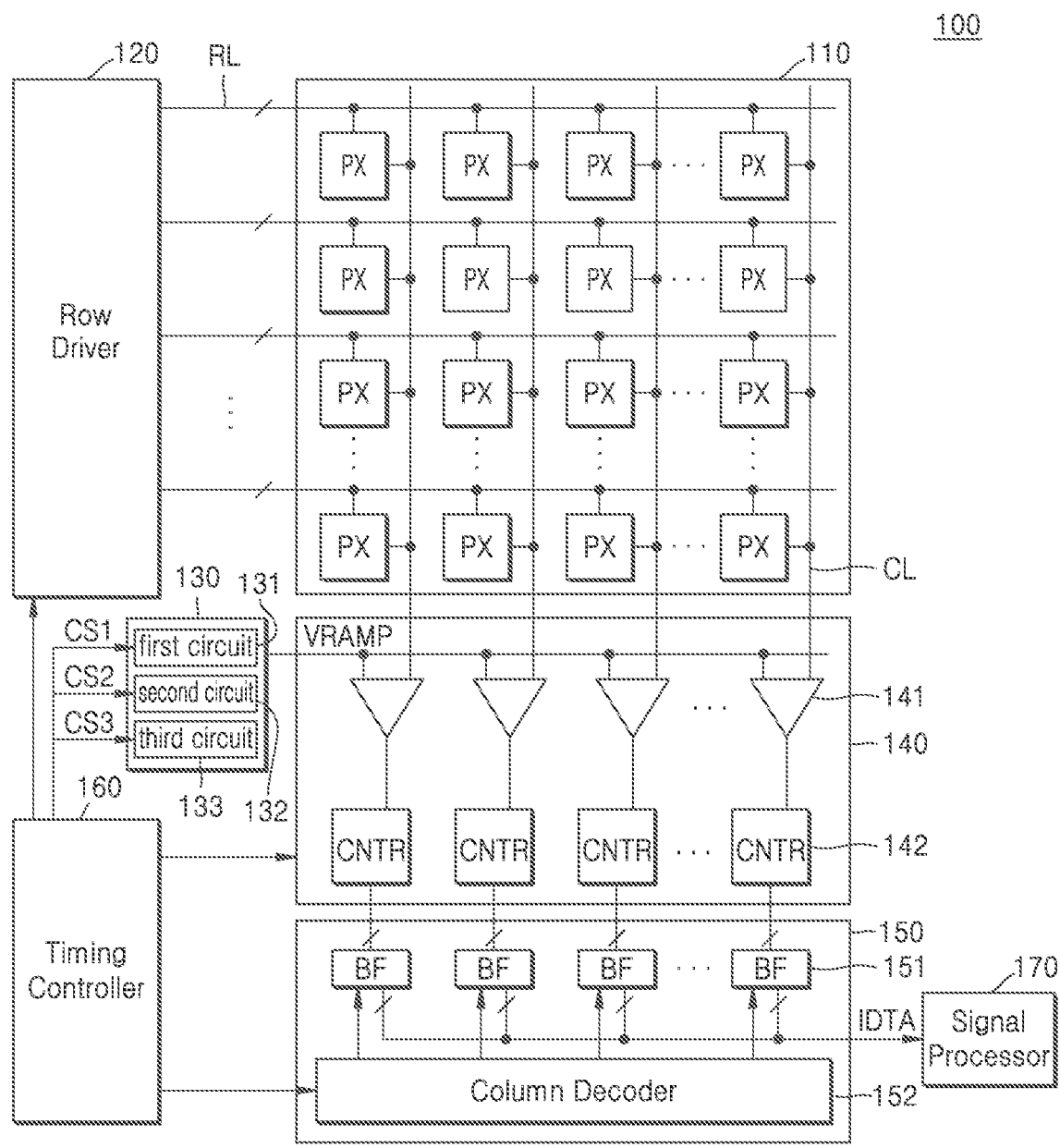
FIG. 1 is a block diagram illustrating a configuration of an image sensor according to an embodiment.

FIG. 1 is a block diagram illustrating a configuration of an image sensor 100 according to an embodiment.

The image sensor 100 may be equipped in an electronic device having an image or light sensing function. For example, the image sensor 100 may be equipped in electronic devices such as cameras, smartphones, wearable devices, Internet of things (IoT) devices, tablet personal computers (PCs), personal digital assistants (PDAs), portable multimedia players (PMPs), and navigation devices. Also, the image sensor 100 may be equipped in an electronic device which is included as a part in vehicles, furniture, manufacturing facilities, doors, and various meters.

The image sensor 100 may include a pixel array 110, a row driver 120, a ramp signal generating device 130, an analog-to-digital conversion circuit (hereinafter referred to as an ADC circuit) 140, a data output circuit 150, and a timing controller 160. The image sensor 100 may further include a signal processor 170.

The pixel array 110 may include a plurality of pixels PX which are connected with a plurality of row lines RL and a plurality of column lines CL and are arranged in a matrix form.

Each of the plurality of pixels PX may include at least one photoelectric conversion device, and each pixel PX may sense light by using the photoelectric conversion device and may output an image signal which is an electrical signal based on the sensed light. For example, the photoelectric conversion device may include a photodiode, a phototransistor, a photogate, or a pinned photodiode.

Each of the plurality of pixels PX may sense light of a certain spectrum area. For example, the plurality of pixels PX may include a red pixel which converts light of a red spectrum area into an electrical signal, a green pixel which converts light of a green spectrum area into an electrical signal, and a blue pixel which converts light of a blue spectrum area into an electrical signal. However, embodiments are not limited thereto, and the plurality of pixels PX may further include a white pixel. As another example, the plurality of pixels PX may include pixels which are provided in different colors, and for example, may include a yellow pixel, a cyan pixel, and a green pixel.

A color filter array for transmitting light of a certain spectrum area may be disposed on the plurality of pixels PX, and a color capable of being sensed by a corresponding pixel may be determined based on a color filter disposed on each of the plurality of pixels PX. However, embodiments are not limited thereto, and in an embodiment, a certain photoelectric conversion device may convert light of a certain wavelength band into an electrical signal, based on a level of an electrical signal applied to the certain photoelectric conversion device.

The row driver 120 may drive the pixel array 110 by row units. The row driver 120 may decode a row control signal (for example, an address signal) received from the timing controller 160 and may select at least one row line from among row lines configuring the pixel array 110 in response to the decoded row control signal. For example, the row driver 120 may generate a selection signal which selects one of a plurality of rows. Also, the pixel array 110 may output a pixel signal (for example, a pixel voltage) from a row selected by the selection signal provided from the row driver 120. The pixel signal may include a reset signal and an image signal.

The row driver 120 may transfer, to the pixel array 110, control signals for outputting the pixel signal, and the pixel PX may operate in response to the control signals to output the pixel signal.

The ramp signal generating device 130 may generate a ramp signal (for example, a ramp voltage) VRAMP where a level thereof increases or decreases with a certain slope, based on control by the timing controller 160. The ramp signal VRAMP of the ramp signal generating device 130 may be an input signal of the ADC circuit 140, and a load capacitor may parasitically occur in an output terminal of the ramp signal generating device 130. The load capacitor may be referred to as a parasitic capacitor $C_{load}$. The ramp signal generating device 130 may include a first circuit 131 for detecting a capacitance of the parasitic capacitor $C_{load}$, a second circuit 132 for charging the parasitic capacitor $C_{load}$ with a ramp signal start voltage, and a third circuit 133 which receives a capacitance from the first circuit 131 to generate the ramp signal. An example where the ramp signal generating device 130 generates the ramp signal VRAMP by using the parasitic capacitor $C_{load}$ will be described below with reference to FIGS. 2 to 5.

The ADC circuit 140 may include a plurality of comparators 141 and a plurality of counter circuits 142. The ADC circuit 140 may convert a pixel signal (for example, a pixel voltage), input from the pixel array 110, into a pixel value which is a digital signal. Each of pixel signals respectively received through a plurality of column lines CL may be converted into a pixel value, which is a digital signal, by the plurality of comparators 141 and the counter circuit 142.

The plurality of comparators 141 may respectively be a plurality of correlated double sampling (CDS) circuits. The CDS circuit may sample a pixel signal provided from the pixel PX, based on a CDS scheme. The CDS circuit may sample a reset signal received as a pixel signal and may compare the sampled reset signal with the ramp signal VRAMP to generate a comparison signal based on the reset signal. The CDS circuit may store the reset signal. Subsequently, the CDS circuit may sample an image signal correlated with the reset signal and may compare the image signal with the ramp signal VRAMP to generate a comparison signal based on the image signal. In an embodiment, the CDS circuit may include two comparators. For example, each of the two comparators may be implemented as an operational transconductance amplifier (OTA) (or a differential amplifier).

The counter circuit 142 may count a level shift time of a comparison result signal output from each of the plurality of comparators 141 to output a count value. In an embodiment, the counter circuit 142 may include a latch circuit and an operational circuit.

The data output circuit 150 may temporarily store a pixel value output from the ADC circuit 140, and then, may output the stored pixel value. The data output circuit 150 may include a plurality of column memories 151 and a column decoder 152. The column memory 151 may store the pixel value received from the counter circuit 142. In some embodiments, each of the plurality of column memories 151 may be included in the counter circuit 142. A plurality of pixel values stored in the plurality of column memories 151 may be output as image data IDTA, based on a control of the column decoder 152.

The timing controller 160 may output control signals CS1 to CS3 to each of the row driver 120, the ramp signal generating device 130, the ADC circuit 140, and the data output circuit 150 to control an operation or a timing of each of the row driver 120, the ramp signal generating device 130, the ADC circuit 140, and the data output circuit 150. In an embodiment, the timing controller 160 may sequentially transfer the control signal CS1, the control signal CS2, and the control signal CS3 to each of the first circuit 131, the second circuit 132, and the third circuit 133, and then, may sequentially and repeatedly transfer the control signal CS1 and the control signal CS2 to the second circuit 132 and the third circuit 133. An example where the timing controller 160 transfers the control signals CS1 to CS3 to the first circuit 131, the second circuit 132, and the third circuit 133 will be described below with reference to FIGS. 9 and 10.

The signal processor 170 may perform noise reduction processing, gain adjustment, waveform normalization processing, interpolation processing, white balance processing, gamma processing, edge emphasis processing, and binning on image data. In an embodiment, the signal processor 170 may be included in a processor outside the image sensor 100. In an embodiment, the signal processor 170 may generate a final digital signal, based on a plurality of digital signals. For example, the signal processor 170 may perform an average operation on binary values of the plurality of digital signals to generate an average value of the digital signals as the final digital signal.

Figure 2:
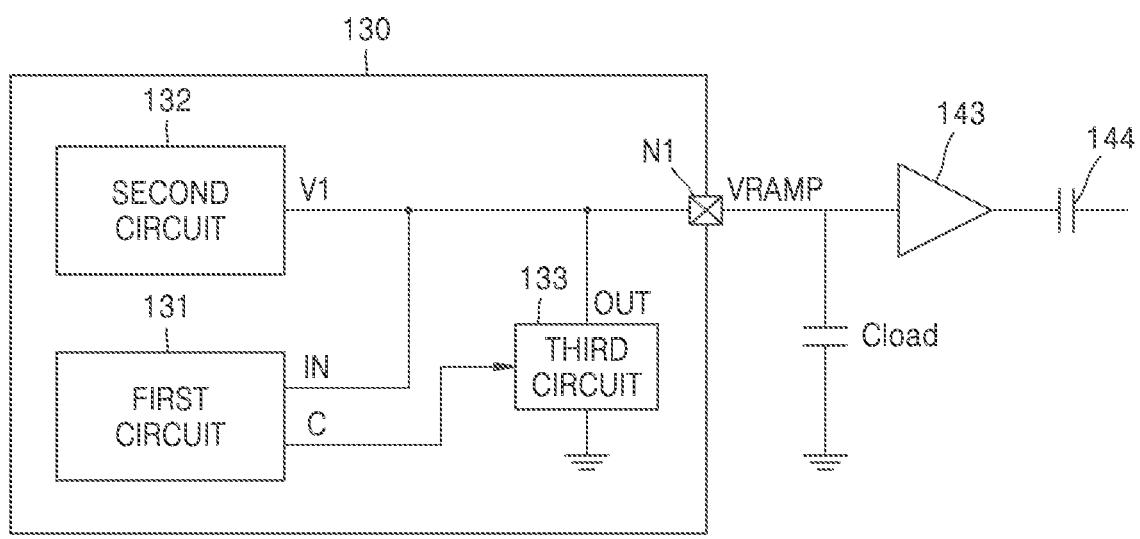
FIG. 2 is a block diagram illustrating a configuration of a ramp signal generating device according to an embodiment.

FIG. 2 is a block diagram illustrating a configuration of a ramp signal generating device 130 according to an embodiment. In some embodiments, the ramp signal generating device 130 of FIG. 2 may be a ramp signal generating device, which is an element of the image sensor 100 of FIG. 1. Referring to FIG. 2, the ramp signal generating device 130 may include a first circuit 131, a second circuit 132, and a third circuit 133. The first, second and third circuits of FIG. 2 may be implemented with a combination of discrete hardware circuit elements such as transistors, resistors, capacitors and switches, voltage and current sources, hardware logic circuits, custom hardware such as an application specific integrated circuit (ASIC), and/or a CPU and memory storing instructions for execution by the CPU. The buffer 143 may be implemented by a combination of discrete hardware circuit elements.

A plurality of buffers 143 may be connected between an output terminal (hereinafter referred to as an output node) N1 of the ramp signal generating device 130 and the ADC circuit 140 of FIG. 1, and the output node N1 may output a ramp signal VRAMP. In some embodiments, the buffer 143 may be a circuit (for example, a column ramp buffer) for preventing kick-back noise caused by an operation of each of the plurality of comparators 141 included in the ADC circuit 140 of FIG. 1, or may be a circuit for decreasing an adverse effect (for example, RC delay) of each of capacitors 144 respectively provided in input terminals of the plurality of comparators 141. The plurality of buffers 143 may receive the ramp signal VRAMP output from the output node N1 and may buffer the received ramp signal VRAMP to transfer the buffered ramp signal VRAMP to the plurality of comparators 141 of FIG. 1. In some embodiments, each buffer of the plurality of buffers 143 is coupled to a corresponding comparator of the plurality of comparators 141. Load capacitors may occur between the output node N1 and the plurality of buffers 143, and a load capacitor may be referred to as a parasitic capacitor $C_{load}$. In some embodiments, an input terminal IN of the first circuit 131, an output terminal (for example, a terminal for outputting a ramp signal start voltage V1) of the second circuit 132, and an output terminal OUT of the third circuit 133 may be connected to the output node N1. The first circuit 131 may detect a capacitance C of a parasitic capacitor $C_{load}$ of the output node N1. The second circuit 132 may charge the ramp signal VRAMP of the output node N1 as the ramp signal start voltage V1. The third circuit 133 may receive the capacitance C from the first circuit 131 and may generate a current which enables the ramp signal start voltage V1 to vary at a certain rate, based on the received capacitance C. For example, the ramp signal VRAMP of the output node N1 may be a signal where a voltage of the parasitic capacitor $C_{load}$ falls from the ramp signal start voltage V1 with a certain slope, based on a current generated by the third circuit 133. Details of the first circuit 131, the second circuit 132, and the third circuit 133 will be described below with reference to FIGS. 3 to 5.

Figure 3A:
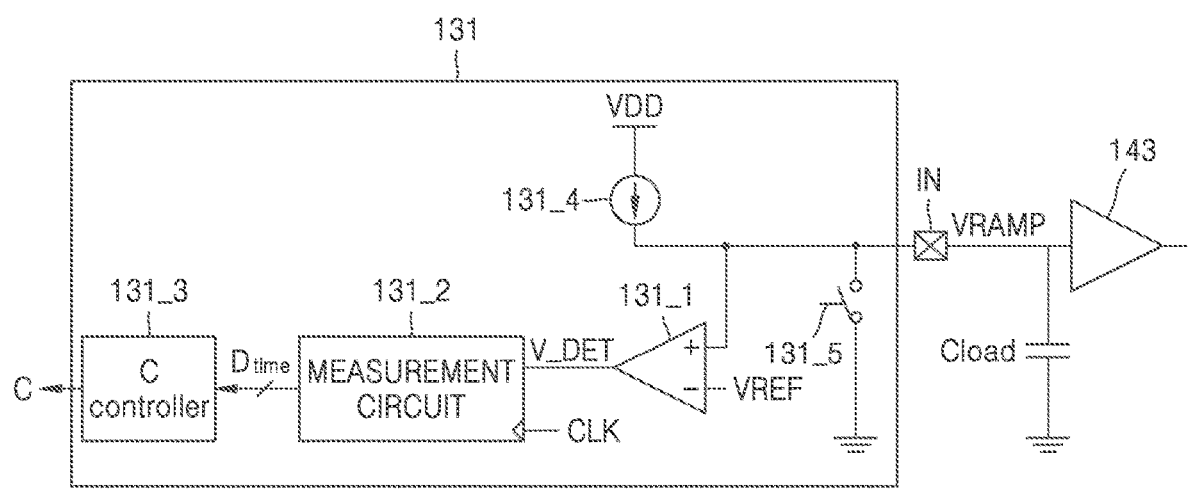
FIG. 3A is a block diagram illustrating a configuration of a first circuit according to an embodiment.
Figure 3B:
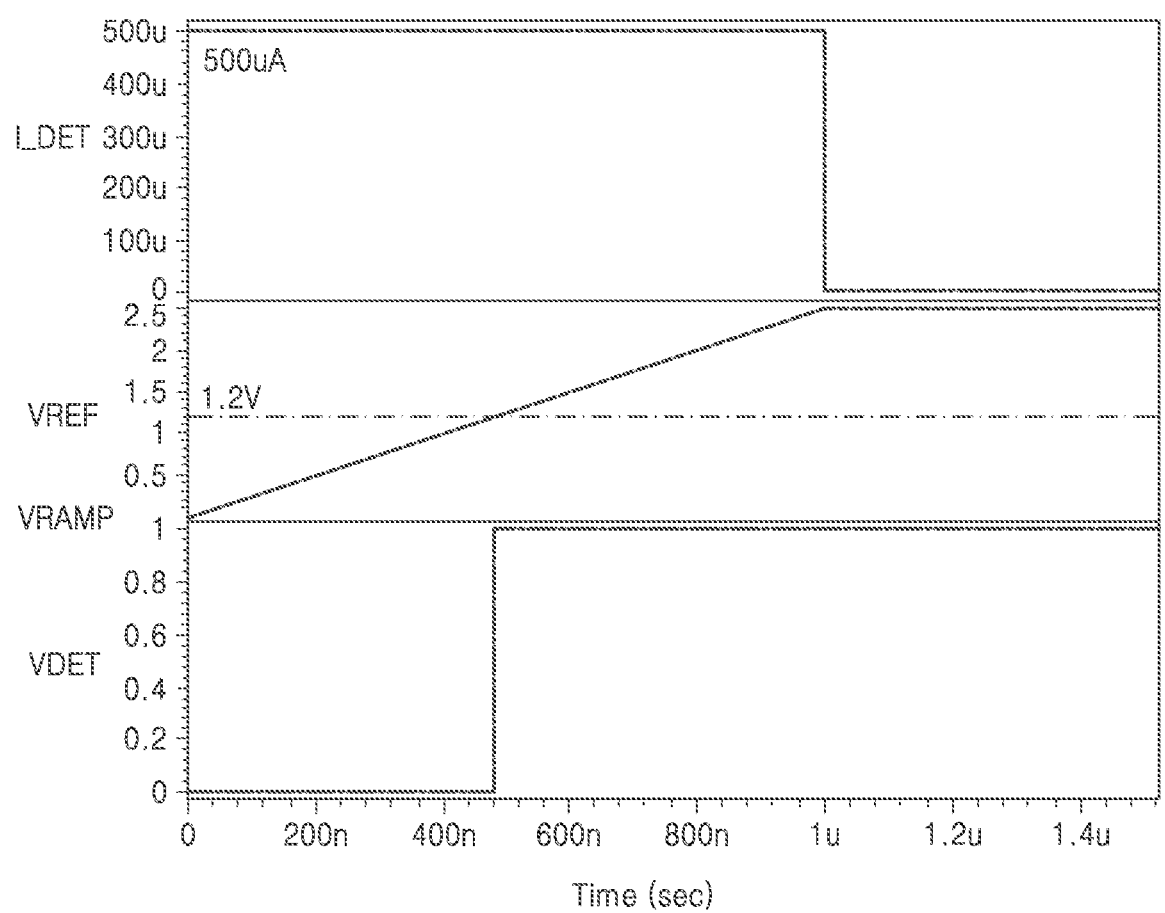
FIG. 3B is a graph for describing an operation of a first circuit according to an embodiment.

FIG. 3A is a block diagram illustrating a configuration of a first circuit 131 according to an embodiment. FIG. 3B is a graph for describing an operation of the first circuit 131 according to an embodiment. Referring to FIG. 3A, the first circuit 131 may include a detection voltage generating circuit 131_1, a measurement circuit 131_2, a capacitor controller 131_3, a detection current source 131_4, and a reset switch 131_5, and an input terminal IN of the first circuit 131 may be connected with a parasitic capacitor $C_{load}$. The parasitic capacitor $C_{load}$ may be the same as the parasitic capacitor $C_{load}$ of FIG. 2. For example, load capacitors may occur between the input terminal IN of the first circuit 131 and input terminals of a plurality of buffers 143, and a load capacitor may be referred to as a parasitic capacitor $C_{load}$.

The detection voltage generating circuit 131_1 may compare a voltage of the parasitic capacitor $C_{load}$ with a reference voltage VREF to generate a detection voltage V_DET. Referring further to FIG. 3B, in some embodiments, the reference voltage VREF may be a direct current (DC) voltage having a certain voltage level (for example, VREF=1.2 V), and a level of a voltage (for example, VRAMP) of the parasitic capacitor $C_{load}$ may rise with a certain slope. An initial value of the detection voltage V_DET may be a first voltage level (for example, 0 V), and when a level of a voltage of a parasitic capacitor rises to be constant and then becomes equal to a level of the reference voltage VREF, the detection voltage generating circuit 131_1 may generate the detection voltage V_DET having a second voltage level (for example, 1 V).

The measurement circuit 131_2 may generate a first measurement value as an output, based on a level variation of an input voltage. Referring further to FIG. 3B, in some embodiments, the measurement circuit 131_2 may receive the detection voltage V_DET from the detection voltage generating circuit 131_1 and may output, as a measurement value $D_{time}$, a time (for example, time=480 ns) taken until the detection voltage V_DET is shifted from a first level to a second level. The time taken until the detection voltage V_DET is shifted from the first level to the second level may be measured by using a clock signal CLK.

The capacitor controller 131_3 may detect a capacitance C of the parasitic capacitor $C_{load}$, based on the measurement value $D_{time}$. In some embodiments, the capacitor controller 131_3 may receive the measurement value $D_{time}$ from the measurement circuit 131_2 and may detect the capacitance C of the parasitic capacitor $C_{load}$, based on the measurement value $D_{time}$. For example, the capacitor controller 131_3 may perform an arithmetic operation on the measurement value $D_{time}$, a detection current $I_{DET}$, and the reference voltage VREF to detect the capacitance C, and the capacitance C of the parasitic capacitor $C_{load}$ may satisfy the following Equation 1. The first circuit 131 may transfer the capacitance C of the parasitic capacitor $C_{load}$, detected by the capacitor controller 131_3, to the third circuit 133 of FIG. 2.

$$C = \frac{D_{time} \cdot I_{DET}}{VREF} \quad \text{[Equation 1]}$$

The detection current source 131_4 may be connected with the input terminal IN of the first circuit 131 and may generate the detection current $I_{DET}$ (for example, I_DET of FIG. 3B=500 uA) which is a DC current. In some embodiments, the detection current source 131_4 may generate the detection current $I_{DET}$ to increase a voltage level of the parasitic capacitor $C_{load}$ with a certain slope.

The reset switch 131_5 may be connected with the input terminal IN of the first circuit 131 and may discharge the parasitic capacitor $C_{load}$. In some embodiments, the reset switch 131_5 may be turned on before the first circuit 131 detects the capacitance C of the parasitic capacitor $C_{load}$ and may connect the input terminal IN of the first circuit 131 with a ground to discharge the parasitic capacitor $C_{load}$. The reset switch 131_5 may be turned off after the parasitic capacitor $C_{load}$ is discharged and may disconnect the input terminal IN of the first circuit 131 from the ground, and the first circuit 131 may detect the capacitance C of the parasitic capacitor $C_{load}$. In some embodiments, the reset switch 131_5 may receive a control signal from a timing controller (160 of FIG. 1), and thus, may connect or disconnect the input terminal IN of the first circuit 131 with or from the ground.

Figure 4:
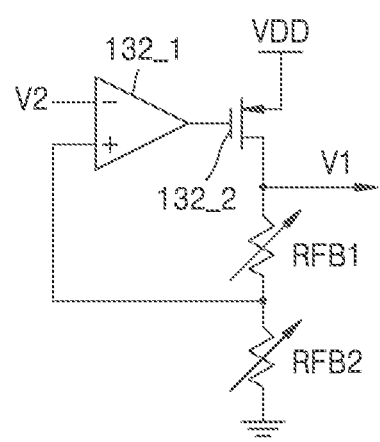
FIG. 4 is a block diagram illustrating a configuration of a second circuit according to an embodiment.

FIG. 4 is a block diagram illustrating a configuration of a second circuit 132 according to an embodiment. Referring to FIG. 4, the second circuit 132 may include an amplifier 132_1, a transistor 132_2, and a plurality of variable resistors (for example, a first variable resistor and a second variable resistor) RFB1 and RFB2. For example, the second circuit 132 may be a low-dropout (LDO) regulator, but embodiments are not limited thereto.

In some embodiments, the amplifier 132_1 may generate an output voltage by using a reference voltage V2 and a node voltage between the first variable resistor RFB1 and the second variable resistor RFB2 as an input. The output voltage generated by the amplifier 132_1 may be applied to a gate of the transistor 132_2, and a voltage (for example, a ramp signal start voltage V1) may be output at a node between a source of the transistor 132_2 and the first variable resistor RFB1. The ramp signal start voltage V1 may satisfy the following Equation 2.

$$V_1 = V_2 \cdot \frac{(R1 + R2)}{R2} \quad \text{[Equation 2]}$$

In Equation 2, R1 may denote a resistance value of the first variable resistor RFB1, R2 may denote a resistance value of the second variable resistor RFB2, and the ramp signal start voltage V1 may be set by adjusting R1 and R2. An output terminal (for example, a terminal for outputting the ramp signal start voltage V1) of the second circuit 132 may be charged with the ramp signal start voltage V1, which is set, of the parasitic capacitor $C_{load}$ of FIG. 2.

Figure 5A:
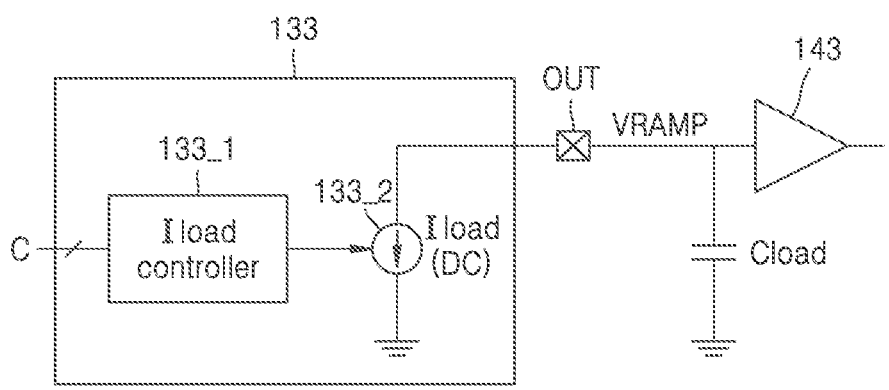
FIG. 5A is a block diagram illustrating a configuration of a third circuit according to an embodiment.

FIG. 5A is a block diagram illustrating a configuration of a third circuit 133 according to an embodiment. Referring to FIG. 5A, the third circuit 133 may include a current controller 133_1 and a ramp current source 133_2, and an output terminal OUT of the third circuit 133 may be connected with a parasitic capacitor $C_{load}$. The parasitic capacitor $C_{load}$ may be the same as the parasitic capacitor $C_{load}$ of FIG. 2. For example, load capacitors may occur between the output terminal OUT of the third circuit 133 and input terminals of a plurality of buffers 143, and a load capacitor may be referred to as a parasitic capacitor $C_{load}$.

The current controller 133_1 may determine a value of a current $I_{load}$, based on a capacitance C. In some embodiments, the current controller 133_1 may receive the capacitance C from the first circuit 131 of FIG. 2 and may determine the value of the current $I_{load}$ which satisfies the following Equation 3.

$$I_{load} = -\frac{dVRAMP}{dt} \cdot C \quad \text{[Equation 3]}$$

In Equation 3, dVRAMP/dt may denote a voltage level slope of the ramp signal VRAMP generated by the ramp signal generating device 130 of FIG. 2, and — may denote a negative slope, namely, may denote that the ramp signal VRAMP falls with a slope of dVRAMP/dt. The value of the current $I_{load}$ may be determined based on the ramp signal VRAMP which is to be output by the ramp signal generating device 130 of FIG. 2. The current may be referred to as a load current. The solution from Equation 3, Iload, is used to set the slope of the reference signal, Vramp, used to capture the pixel values at the ADC 141 (see the ramp marked "Ideal" in FIG. 7B). The slope is set by the load current generated by the third circuit 133; the load current discharges Cload at a fixed rate. The load current generated by the third circuit 133 may be slightly different than the calculated value, due to practical implementation of the third circuit 133. For example, the discharge current may be obtained using n+1 current sources such as in FIG. 5B, where n is finite rather than infinite.

The ramp current source 133_2 may generate a first DC current corresponding to the value of the current $I_{load}$ determined by the current controller 133_1. In some embodiments, referring further to FIG. 2, the second circuit 132 may charge the ramp signal VRAMP of the output node N1 with a ramp signal start voltage V1, and then, the ramp current source 133_2 may receive the value of the current $I_{load}$ from the current controller 133_1 to generate the first DC current corresponding to the value of the current $I_{load}$. The ramp signal VRAMP of the output node N1 may be a signal where a voltage of the parasitic capacitor $C_{load}$ falls from the ramp signal start voltage V1 with a certain slope, based on the first DC current, and the ramp signal generating device 130 may transfer the ramp signal VRAMP, falling with a certain slope, to the plurality of buffers 143.

Figure 5B:
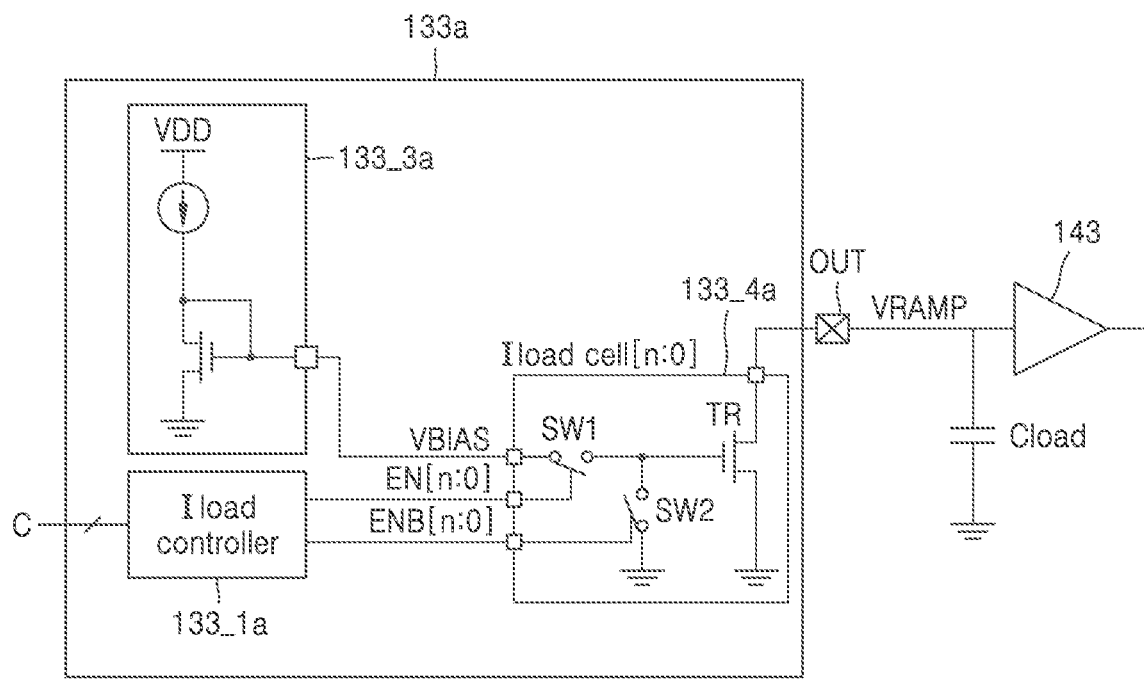
FIG. 5B is a block diagram illustrating an implementation example of a third circuit according to an embodiment.

FIG. 5B is a block diagram illustrating an implementation example of a third circuit 133a according to an embodiment. In some embodiments, the third circuit 133a of FIG. 5B may be an embodiment of the third circuit 133 of FIG. 5A. Referring to FIG. 5B, the third circuit 133a may include a current controller 133_1a, a current bias 133_3a, and a current array 133_4a, and an output terminal OUT of the third circuit 133a may be connected to a parasitic capacitor $C_{load}$. The parasitic capacitor $C_{load}$ may be the same as the parasitic capacitor $C_{load}$ of FIG. 2. For example, load capacitors may occur between the output terminal OUT of the third circuit 133 and input terminals of a plurality of buffers 143, and a load capacitor may be referred to as a parasitic capacitor $C_{load}$.

The current controller 133_1a may determine a value of a current $I_{load}$, based on a capacitance C. The current controller 133_1a may determine a current cell included in the current array 133_4a receiving an enable signal EN or an enable bar signal ENB, based on the determined value of the current $I_{load}$, and may transfer the enable signal EN or the enable bar signal ENB. In some embodiments, an operation of determining the value of the current $I_{load}$ on the basis of the capacitance C by using the current controller 133_1a may be the same as an operation of the current controller 133_1 of FIG. 5A.

The current array 133_4a may include a plurality of current cells. For example, the number of current cells may be an n+1 (where n is an integer of 0 or more) number, and the current array 133_4a including n+1 number of current cells may be referred to as $I_{load}$ cell[n:0].

The current bias 133_3a may generate a bias voltage VBIAS. In some embodiments, each of the current cells may include a transistor TR, a first switch SW1, and a second switch SW2, and a gate of the transistor TR may be connected with the first switch SW1 and the second switch SW2. The current cell may generate an output current, based on an input voltage. For example, when the current cell receives the enable signal EN from the current controller 133_1a, the bias voltage VBIAS may be applied to a transistor gate of the current cell by the first switch SW1, and thus, the current cell may generate the output current. When the current cell receives the enable bar signal ENB from the current controller 133_1a, the transistor gate of the current cell may be connected with a ground by the second switch SW2, and thus, the current cell may not generate the output current.

The current array 133_4a may generate a second DC current corresponding to the value of the current $I_{load}$. In some embodiments, the second DC current may be a sum of output currents generated by the current cells. The current controller 133_1a may determine a current cell which receives the enable signal EN, based on the value of the current $I_{load}$, and the current array 133_4a may generate the second DC current, based on the number of current cells receiving the enable signal EN. The ramp signal VRAMP may be a signal where a voltage of the parasitic capacitor $C_{load}$ falls from the ramp signal start voltage V1 with a certain slope, based on the second DC current, and the ramp signal generating device 130 may transfer the ramp signal VRAMP, falling with a certain slope, to the plurality of buffers 143.

Figure 6:
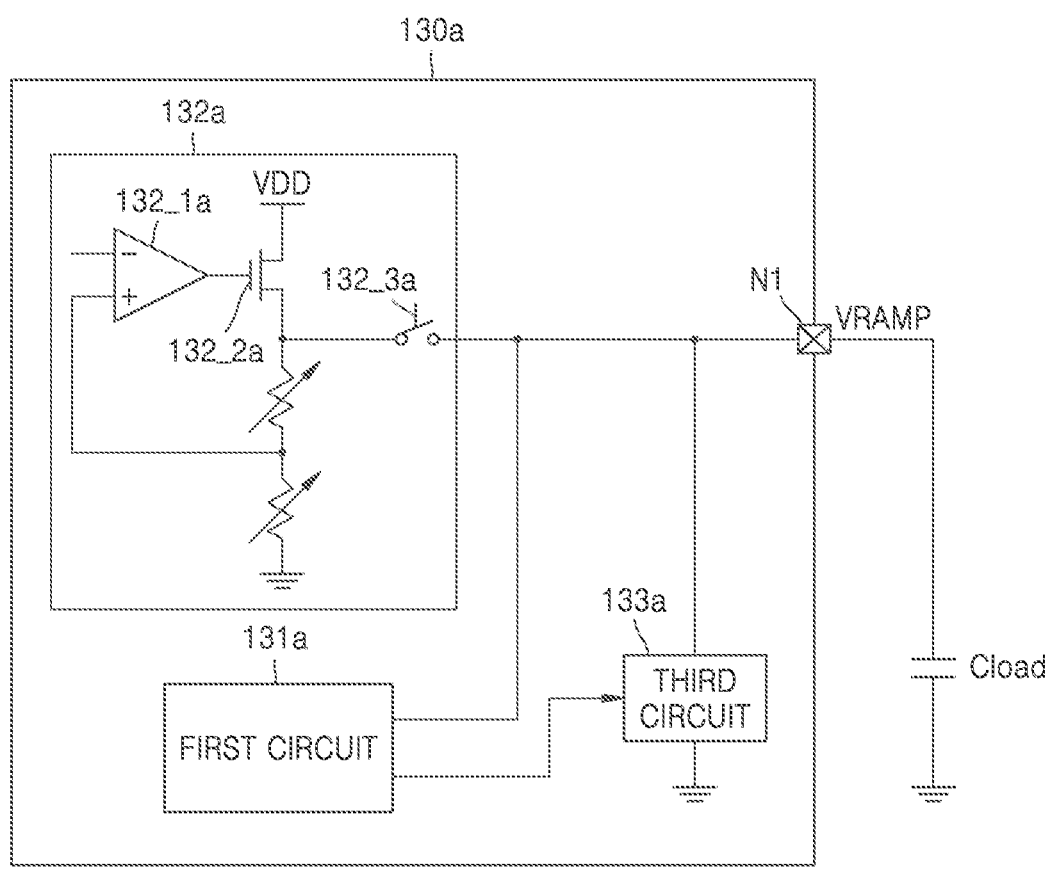
FIG. 6 is a block diagram illustrating a configuration of a ramp signal generating device according to an embodiment.

FIG. 6 is a block diagram illustrating a configuration of a ramp signal generating device 130a according to an embodiment. In some embodiments, the ramp signal generating device 130a of FIG. 6 may be an embodiment of the ramp signal generating device 130 of FIG. 2. Referring to FIG. 6, the ramp signal generating device 130a may include a first circuit 131a, a second circuit 132a, and a third circuit 133a. The first circuit 131a and the third circuit 133a may be the same as the first circuit 131a and the third circuit 133a of FIG. 2, and thus, repeated descriptions thereof are omitted.

The second circuit 132a may include an amplifier 132_1a, a transistor 132_2a, a plurality of variable resistors RFB1 and RFB2, and a switch 132_3a. The amplifier 132_1a, the transistor 132_2a, and the plurality of variable resistors RFB1 and RFB2 may be the same as the amplifier 132_1, the transistor 132_2, and the plurality of variable resistors RFB1 and RFB2 of FIG. 4, and thus, repeated descriptions thereof are omitted.

The switch 132_3a may connect or disconnect an output terminal of the second circuit 132a with or from an output terminal N1 of the ramp signal generating device 130a. For example, the switch 132_3a may be turned off and the first circuit 131a may detect a capacitance of a parasitic capacitor $C_{load}$, and then, the switch 132_3a may be turned on. The second circuit 132a may charge the parasitic capacitor $C_{load}$ with the ramp signal start voltage V1 of FIG. 4, and the switch 132_3a may be turned off again. The third circuit 133a may generate a ramp signal VRAMP, based on the capacitance detected by the first circuit 131a, and the ramp signal VRAMP may be a signal which falls from the ramp signal start voltage V1 with a certain slope. In some embodiments, the switch 132_3a may receive a control signal from a timing controller (160 of FIG. 1), and thus, may connect or disconnect an output terminal of the second circuit 132a with or from an output terminal N1 of the ramp signal generating device 130a.

Figure 7A:
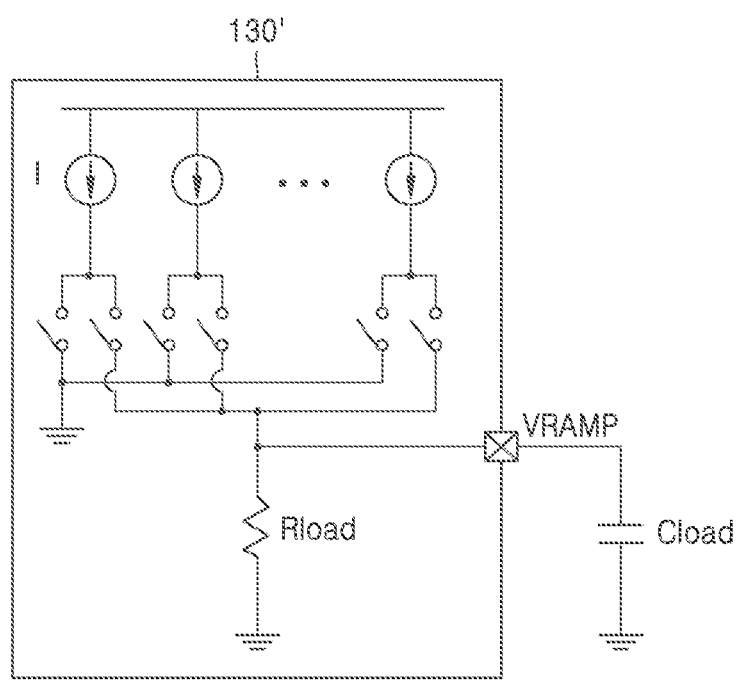
FIG. 7A is a block diagram illustrating a configuration of a ramp signal generating device according to a comparative example.
Figure 7B:
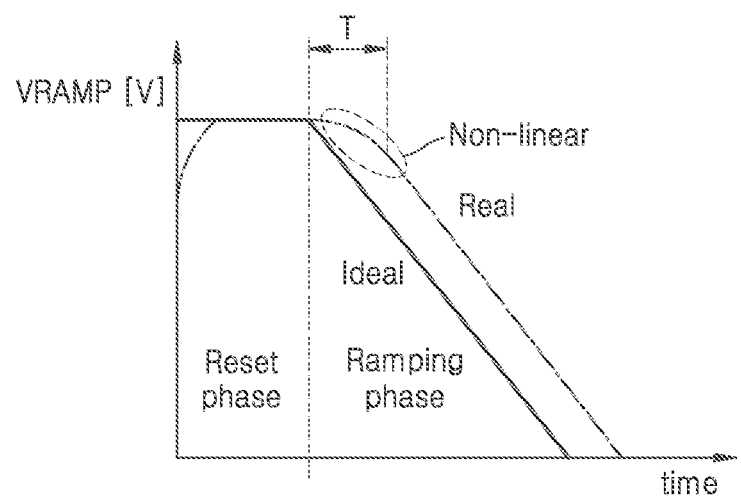
FIG. 7B is a graph showing the ramp signal latency of the ramp signal generating device according to the comparative example.

FIG. 7A is a block diagram illustrating a configuration of a ramp signal generating device 130' according to a comparative example, and FIG. 7B is a graph showing the ramp signal latency of the ramp signal generating device 130' according to the comparative example. FIGS. 7A and 7B illustrate a block diagram and a graph for describing a problem which may occur when a load resistor is included in a ramp signal generating device.

Referring to FIGS. 7A and 7B, the ramp signal generating device 130' may include a plurality of current sources I and a load resistor $R_{load}$. In a case where an analog-to-digital conversion circuit compares a pixel signal with a ramp signal, an ideal ramp signal generating device (Ideal) may generate the ramp signal which falls with a certain slope. On the other hand, the ramp signal generating device (Real) 130' may include the load resistor $R_{load}$, and thus, the latency (for example, RC time delay) of the ramp signal may occur due to the load resistor $R_{load}$ and a parasitic capacitor $C_{load}$. Compared to the ideal ramp signal generating device (Ideal), the delay of a T period may occur, and then, the ramp signal may fall with a certain slope. Therefore, an image sensor including the ramp signal generating device (Real) 130' may not operate at a high speed. When the load resistor $R_{load}$ is reduced for decreasing the latency of the ramp signal, a current generated by each of a plurality of current sources may increase, and thus, power consumption may increase. The ramp signal generating device 130 of FIG. 2 may be used for solving a problem where the latency of the ramp signal occurs and power consumption increases.

Figure 8B:
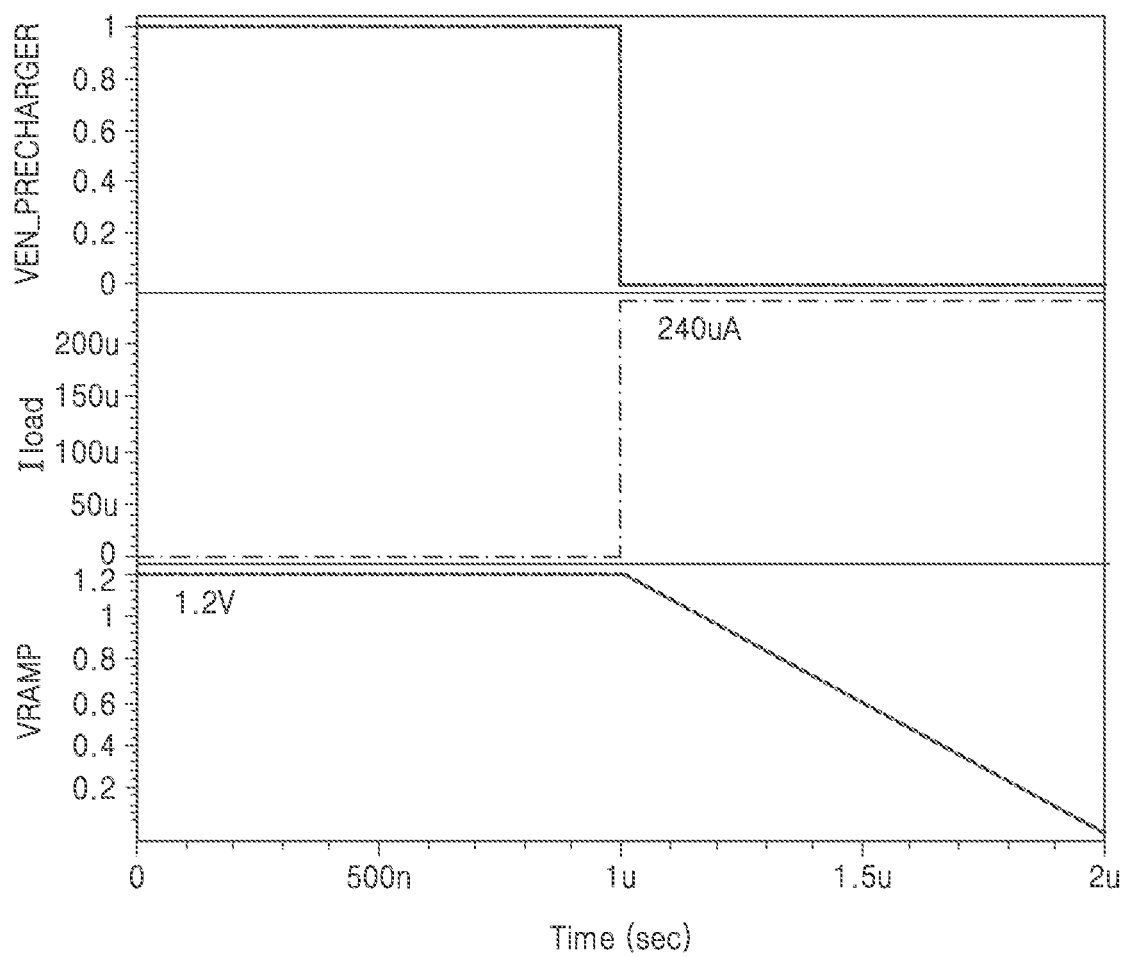

FIGS. 8A and 8B are a look-up table and a graph for describing an operation of a ramp signal generating device (130 of FIG. 2) according to an embodiment, and FIG. 8C is a table showing a result obtained by comparing current consumptions of ramp signal generating devices. In FIGS. 8A to 8C, an example will be described where a slope (dVRAMP/dt) of a ramp signal VRAMP generated by the ramp signal generating device (130 of FIG. 2) is about 1.2 V/1 us, a value of a current $I_{DET}$ generated by a detection current source (131_4 of FIG. 3) is about 500 uA, and a reference voltage VREF generated by a detection voltage generating circuit (131_2 of FIG. 3) is about 1.2 V, but embodiments are not limited thereto. For example, each of the slope (dVRAMP/dt) of the ramp signal VRAMP, the value of the current $I_{DET}$, and the reference voltage VREF may have an arbitrary value.

In some embodiments, referring to FIGS. 3, 4, 5, and 8A, a measurement value $D_{time}$ of 480 ns may be generated by the measurement circuit 131_2, and the capacitor controller 131_3 may receive the measurement value $D_{time}$ to detect 200 pF as C which satisfies Equation 1. Subsequently, the second circuit 132 may charge the parasitic capacitor $C_{load}$ with the ramp signal start voltage V1, and the ramp signal start voltage V1 may be about 1.2 V. The current controller 133_1 may determine a value of a current ($I_{load}$=240 uA) satisfying Equation 1 so that the third circuit 133 generates the ramp signal VRAMP satisfying a value of a slope (1.2V/1 us), based on C (200 pF) detected by the capacitor controller 131_3, and when a gain of an ADC circuit (140 of FIG. 1) is once a reference gain, the ramp current source 133_2 may generate a current of about 240 uA.

Referring further to FIG. 8B, a ramp signal generating device (130 of FIG. 2) using only a parasitic capacitor $C_{load}$ may reduce the latency of a ramp signal. In FIG. 8B, the x-axis is time and three y-axes are provided (VRAMP, Iload and VEN_PRECHARGER). For example, unlike how the latency of a ramp signal in a T period (see the graph of FIG. 7B) occurs in a ramp signal generating device (130' of FIG. 7A) including a load resistor $R_{load}$, it may be seen that, in a case (time=1 u) where the ramp current source 133_2 generates a current of about 240 uA, the ramp signal VRAMP falls from a ramps signal start voltage (V1=1.2) with a certain slope (dVRAMP/dt=1.2V).

Referring further to FIG. 8C, a ramp signal generating device (130 of FIG. 2) using only a parasitic capacitor $C_{load}$ may be less in power consumption than a ramp signal generating device (130' of FIG. 7A) including a load resistor $R_{load}$. For example, the load resistor $R_{load}$ of the ramp signal generating device (130' of FIG. 7A) may have about 120Ω, and a current of about 10 mA may be needed so that the ramp signal VRAMP falls from the ramps signal start voltage (V1=1.2) with a certain slope (dVRAMP/dt=1.2V). On the other hand, the ramp signal generating device (130 of FIG. 2) may need a current of about 240 uA which is lower than 10 mA, and because the ramp signal generating device (130 of FIG. 2) needs a low current, power consumption may decrease.

Referring again to FIG. 8A, a gain of an ADC circuit (140 of FIG. 1) may be differently implemented by adjusting a value of a current generated by the ramp current source 133_2. For example, when a slope (dVRAMP/dt) of the ramp signal VRAMP becomes gentle, the gain of the ADC circuit (140 of FIG. 1) may increase, and for example, the gain of the ADC circuit (140 of FIG. 1) may increase in inverse proportion to a value of a current $I_{load}$. Accordingly, the ramp signal generating device (130 of FIG. 2) may adjust the gain of the ADC circuit even without a load resistor.

Figure 10:
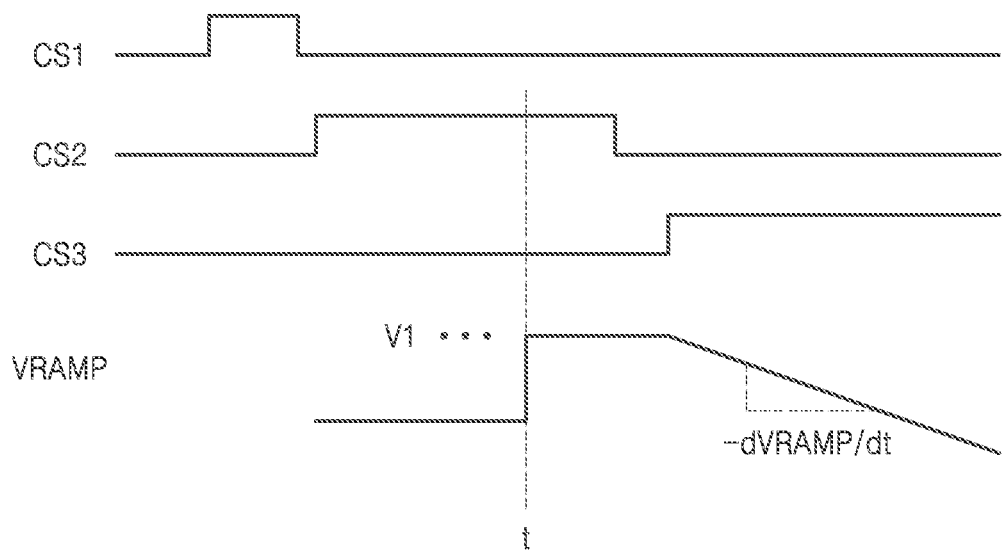
FIG. 10 is a signal timing diagram according to an embodiment.

FIG. 9 is a flowchart illustrating a ramp signal generating method 900 according to an embodiment, and FIG. 10 is a signal timing diagram according to an embodiment. As illustrated in FIG. 9, the ramp signal generating method 900 may include a plurality of operations S910 to S950.

Referring to FIGS. 1, 3, 9, and 10, in operation S910, the first circuit 131 may detect a capacitance C of the parasitic capacitor $C_{load}$. In some embodiments, the first circuit 131 may receive the control signal CS1 from the timing controller 160, and when the control signal CS1 has a first level (for example, logic high), the first circuit 131 may detect the capacitance C of the parasitic capacitor $C_{load}$. For example, the detection current source 131_4 may generate a certain current $I_{DET}$ and may increase a voltage level of the parasitic capacitor $C_{load}$ with a certain slope, and the detection voltage generating circuit 131_1 may compare the reference voltage VREF with a voltage of the parasitic capacitor $C_{load}$ increased by the detection current source 113_4 to generate the detection voltage V_DET. The measurement circuit 131_2 may generate a measurement value, based on a level variation of the detection voltage V_DET, and the capacitor controller 131_3 may detect the capacitance C of the parasitic capacitor $C_{load}$, based on the measurement value.

In operation S930, the second circuit 132 may charge a voltage of the parasitic capacitor $C_{load}$ with a first voltage (for example, a ramp signal start voltage). In some embodiments, the second circuit 132 may receive the control signal CS2 from the timing controller 160, and when the control signal CS2 has the first level, the second circuit 132 may detect the voltage of the parasitic capacitor $C_{load}$ as the ramp signal start voltage. For example, at a t time, the ramp signal VRAMP may rise to V1.

In operation S950, the third circuit 133 may generate a current, based on the detected capacitance C. In some embodiments, the third circuit 133 may receive the control signal CS3 from the timing controller 160, and when the control signal CS3 has the first level, the third circuit 133 may generate a current, based on the detected capacitance C. For example, referring further to FIG. 5, the current controller 133_1 may determine the value of the current $I_{load}$, based on the capacitance C detected by the capacitor controller 131_3, and the ramp current source 133_2 may generate a certain current (for example, a DC current) corresponding to the value of the current $I_{load}$ determined by the current controller 133_1. Based on the certain current generated by the ramp current source 133_2, the ramp signal VRAMP may fall from V1 with a certain slope (−dVRAMP/dt).

In some embodiments, in operation S910, after the first circuit 131 detects the capacitance C of the parasitic capacitor $C_{load}$, the ramp signal generating device 130 may repeat operation S930 and operation S950. For example, operation S930 and operation S950 may be performed based on the capacitance C which is detected in operation S910, and thus, a current may be generated and the detected capacitance C may be stored in one time programmable (OTP) of an image sensor. The ramp signal generating device 130 may repeat operation S930 and operation S950, based on the detected capacitance C, and may adjust a current, based on a gain of the ADC circuit (140 of FIG. 1). Because operation S910 is performed only once, a time for an operation of an image sensor may be reduced.

While certain embodiments have been particularly shown and described, it will be understood that various changes in form and details may be made therein without departing from the spirit and scope of the following claims.

What is claimed is:

1. A ramp signal generating device comprising:
   an output node configured to output a ramp signal;
   a first circuit configured to detect, based on a measurement value, a capacitance of a parasitic capacitor;
   a second circuit configured to charge the ramp signal of the output node with a ramp signal start voltage; and
   a third circuit configured to generate a load current enabling the ramp signal start voltage to vary with a first predetermined slope, based on the detected capacitance,
   wherein the parasitic capacitor is associated with the output node provided between the output node and a plurality of buffers which are connected to the output node and receive and buffer the ramp signal, and
   wherein the plurality of buffers are configured to transfer the buffered ramp signal to a plurality of comparators.

2. The ramp signal generating device of claim 1, wherein the first circuit comprises:
   a detection voltage generating circuit configured to compare a reference voltage with a voltage of the parasitic capacitor to generate a detection voltage;

a measurement circuit configured to receive the detection voltage from the detection voltage generating circuit to generate the measurement value; and a capacitor controller configured to receive the measurement value from the measurement circuit to detect the capacitance.

3. The ramp signal generating device of claim 2, wherein the first circuit further comprises:

a detection current source configured to generate a detection current; and a reset switch configured to discharge the parasitic capacitor, and wherein the detection current source and the reset switch are connected to an input terminal of the first circuit.

4. The ramp signal generating device of claim 3, wherein the detection current source is further configured to generate the detection current to increase the voltage of the parasitic capacitor with a second predetermined slope, wherein the detection voltage generating circuit is further configured to shift the detection voltage from a first voltage level to a second voltage level when the reference voltage is equal to the voltage of the parasitic capacitor, and wherein the measurement circuit is further configured to generate, as the measurement value, a time taken until the detection voltage is shifted from the first voltage level to the second voltage level.

5. The ramp signal generating device of claim 3, wherein the capacitor controller is further configured to perform an arithmetic operation on the measurement value, the detection current, and the reference voltage to detect the capacitance.

6. The ramp signal generating device of claim 4, wherein the reset switch is configured to be turned on and discharge the parasitic capacitor, and wherein the detection current source is further configured to increase the voltage of the parasitic capacitor with the second predetermined slope after the parasitic capacitor is discharged.

7. The ramp signal generating device of claim 1, wherein the second circuit is a low-dropout (LDO) regulator.

8. The ramp signal generating device of claim 1, wherein the second circuit further comprises a switch connected with an output terminal of the second circuit, and wherein the switch is configured to be turned off after the second circuit charges the parasitic capacitor to the ramp signal start voltage.

9. The ramp signal generating device of claim 1, wherein the third circuit comprises:

a current controller configured to determine a value of the load current, based on the capacitance; and a ramp current source configured to generate a first direct current (DC) current corresponding to the load current.

10. The ramp signal generating device of claim 9, wherein the current controller is further configured to perform an arithmetic operation on the capacitance to determine the value of the load current, and wherein, based on the first DC current controlling the ramp signal, a voltage of the parasitic capacitor is configured to fall from the ramp signal start voltage with the first predetermined slope.

11. The ramp signal generating device of claim 1, wherein the third circuit comprises:

a current array configured to generate a second direct current (DC) current corresponding to the load current, the current array including a plurality of current cells;

a current bias circuit configured to generate a bias voltage and transfer the bias voltage to each of the plurality of current cells; and a current controller configured to generate an enable signal or an enable bar signal and transfer the enable signal or the enable bar signal to each current cell, each of the plurality of current cells comprises a transistor, a first switch, and a second switch, and a gate of the transistor is connected to the first switch and the second switch.

12. The ramp signal generating device of claim 11, wherein the current controller is further configured to perform an arithmetic operation on the capacitance to determine the load current and receive the enable signal or the enable bar signal, based on a value of the load current, and wherein each of the plurality of current cells is configured such that, when the enable signal is received, the first switch is turned on and the gate of the transistor receives the bias voltage, and when the enable bar signal is received, the second switch is turned on and the gate of the transistor is connected with a ground, wherein the current array is further configured to generate the second direct current (DC) current, based on a number of current cells receiving the enable signal, and wherein, based on the second DC current controlling the ramp signal, a voltage of the parasitic capacitor is configured to fall from the ramp signal start voltage with the first predetermined slope.

13. A method of generating a ramp signal in an image sensor, the method comprising:

a first operation of detecting, based on a measurement value, a capacitance of a parasitic capacitor of an output node of a ramp signal generating device provided between the output node of the ramp signal generating device and a plurality of buffers which receive and buffer the ramp signal, wherein the plurality of buffers are configured to transfer the buffered ramp signal to corresponding ones of a plurality of comparators;

a second operation of charging the ramp signal with a ramp signal start voltage; and a third operation of generating a load current enabling the ramp signal start voltage to vary with a first predetermined slope, based on the detected capacitance.

14. The method of claim 13, further comprising:

performing the first operation once; and sequentially repeating the second operation and the third operation.

15. The method of claim 13, wherein the first operation comprises:

comparing a reference voltage with a voltage of the parasitic capacitor to generate a detection voltage;

generating the measurement value, based on the detection voltage; and detecting the capacitance, based on the measurement value.

16. The method of claim 15, wherein the comparing the reference voltage with the voltage of the parasitic capacitor comprises:

discharging the parasitic capacitor by using a reset switch;

generating a detection current by using a detection current source;

increasing the voltage of the parasitic capacitor with the first predetermined slope, based on the detection current; and when the reference voltage is equal to the voltage of the parasitic capacitor, shifting the detection voltage from a first voltage level to a second voltage level, wherein the measurement value is a time taken until the detection voltage is shifted from the first voltage level to the second voltage level, and wherein the detecting of the capacitance comprises performing an arithmetic operation on the measurement value, the detection current, and the reference voltage to detect the capacitance.

17. The method of claim 13, wherein the third operation comprises:

performing an arithmetic operation on the capacitance to determine a value of the load current; and generating a direct current (DC) current corresponding to the load current, wherein, based on the DC current controlling the ramp signal, a voltage of the parasitic capacitor is configured to fall from the ramp signal start voltage with the first predetermined slope.

18. An image sensor comprising:

a pixel array including a plurality of pixels, the pixel array being connected to a plurality of column lines configured to output a plurality of pixel signals generated from the plurality of pixels, respectively;

a ramp signal generating device configured to generate a ramp signal;

a plurality of buffers connected to an output terminal of the ramp signal generating device and configured to receive and buffer the ramp signal, wherein the plurality of buffers are configured to transfer the buffered ramp signal to corresponding ones of a plurality of comparators;

an analog-to-digital conversion circuit configured to analog-to-digital convert the plurality of pixel signals, based on the ramp signal; and a timing controller configured to control a timing of the ramp signal generating device, wherein the ramp signal generating device comprises:

a first circuit configured to detect a capacitance of a parasitic capacitor provided between the output terminal of the ramp signal generating device and the plurality of buffers;

a second circuit configured to charge the ramp signal with a ramp signal start voltage; and a third circuit configured to generate a load current enabling the ramp signal start voltage to vary with a first predetermined slope, based on the detected capacitance.

19. The image sensor of claim 18, wherein the timing controller is further configured to sequentially transfer a control signal to the first circuit, the second circuit, and the third circuit.

20. The image sensor of claim 19, wherein the timing controller is further configured to sequentially and repeatedly transfer the control signal to the second circuit and the third circuit after the first circuit has detected the capacitance.

* * * * *